United States Patent
Lee

(10) Patent No.: US 6,667,649 B1
(45) Date of Patent: Dec. 23, 2003

(54) METHOD AND SYSTEM FOR UTILIZING A HIGH-PERFORMANCE MIXER AS A COMPLETE RECEIVER

(75) Inventor: Sheng-Hann Lee, Saratoga, CA (US)

(73) Assignee: Ralink Technology, Inc., Cupertino, CA (US)

( * ) Notice: Subject to any disclaimer, the term of this patent is extended or adjusted under 35 U.S.C. 154(b) by 0 days.

(21) Appl. No.: 10/146,867

(22) Filed: May 15, 2002

(51) Int. Cl.[7] ................................................. G06F 7/44
(52) U.S. Cl. .......................................... 327/359; 455/326
(58) Field of Search ................................ 327/356, 357, 327/358, 359; 455/326

(56) References Cited

U.S. PATENT DOCUMENTS

| | | | | |
|---|---|---|---|---|
| 4,999,589 A | * | 3/1991 | DaSilva | 331/117 R |
| 5,271,276 A | * | 12/1993 | Katakura et al. | 73/626 |
| 5,517,687 A | * | 5/1996 | Niehenke et al. | 455/325 |
| 6,094,084 A | * | 7/2000 | Abou-Allam et al. | 327/359 |
| 6,157,822 A | * | 12/2000 | Bastani et al. | 455/323 |
| 6,308,058 B1 | * | 10/2001 | Souetinov et al. | 455/326 |
| 6,486,824 B1 | * | 11/2002 | Shupe | 342/16 |

* cited by examiner

Primary Examiner—Timothy P. Callahan
Assistant Examiner—Cassandra Cox
(74) Attorney, Agent, or Firm—Sawyer Law Group LLP

(57) ABSTRACT

A mixer is disclosed. The mixer comprises a high isolation gain stage and an impedance transformation network coupled to the gain stage. The mixer includes a plurality of switching devices coupled to the network and a phase shifter coupled to the plurality of switching devices. The mixer is utilized as a receiver and a low noise amplifier is not needed. A receiver in accordance with the present invention achieves high gain and low noise in the mixer and therefore eliminates the need for a separate LNA. In so doing, an isolation gain stage achieves high gain, and image noise is rejected before entering the mixer stage.

12 Claims, 3 Drawing Sheets

METHOD AND SYSTEM FOR UTILIZING A HIGH-PERFORMANCE MIXER AS A COMPLETE RECEIVER

CROSS-RELATED APPLICATION

The present application is related to application Ser. No. 10/271,909 [(2458P)] entitled GAIN STAGE THAT MINIMIZES THE MILLER EFEECT.

FIELD OF THE INVENTION

The present invention relates generally to a superheterodyne receiver and more particularly to utilizing a mixer as such a receiver.

BACKGROUND OF THE INVENTION

FIG. 1 illustrates a conventional superheterodyne receiver. The typical superheterodyne receiver 10 includes a low noise amplifier (LNA) 12 which is placed near an antenna (not shown) for receiving the signal. The signal typically is at a level that is comparable to a noise component therein. The LNA 12 is coupled to an image-rejection filter 14. The image-rejection filter 14 is coupled to an active mixer 16.

FIG. 2 illustrates a conventional LNA 14. The low noise amplifier includes first and second transistors coupled to a current source. The gain stage is degraded from the Miller Effect capacitance. FIG. 3 illustrates a typical active mixer 16. The active mixer includes four switching devices coupled to the LNA to provide the differential output voltage. Typically the gain of mixer 16 is reduced and the noise is increased due to commutation of the switching devices that decreases the signal level and provides an image noise simultaneously. Each of the stages (LNA 12, filter 14 and mixer 16) provides both gain (G) and noise factor (F) the receiver 10.

In a typical receiver, the noise factor is strongly influenced by the gain distribution, i.e., $$F_{Total}=F_{1st}+(F_{2nd}-1)/G_{1st}+(F_{3rd}-1)/G_{1st}G_{2nd} \quad (1)$$

Where $F_{1st}$ is the LNA 12, $F_{2nd}$ is the filter 14, and $F_{3rd}$ represents the mixer 16. In general, the mixer 16 is a noisy stage and the filter 14 is required to reject image noise from entering the mixer 16. The filter 14 typically provides a loss to the receiver.

In a receiver, the sensitivity is determined by the ratio of the received signal and $F_{Total}$ at the antenna. Since the received signal is dictated by the antenna design, so the designer is limited to noise reduction option in order to maximize the sensitivity. A common approach to minimize the noise factor of the receiver is to provide a LNA 12 with good noise performance and high gain to keep $F_{Total}$ low.

In this configuration, the LNA 12 provides high gain to suppress the noise contributions from the filter 14 and the mixer 16. However, the problem is that with a conventional receiver there is always a compromise between noise and linearity. To further describe this problem, refer now to the following. In a typical receiver there are intermodulation distortion products (IDPs) which are produced by signals that are not of the same frequency but which create spurious signals within the frequency band.

In a typical receiver, the IDPs are produced by two strong signals at one and two times the frequency offset from the frequency of interest interacting with each other in a manner which provides intermodulation distortion at the exact frequency of interest in operation. For example, if the channel is 3 and there are two strong signals, one at channel 10 and one at channel 17, those two signals have a frequency spacing of 7. This frequency spacing of 7 can cause two spurious signals or intermodulation products at the same frequency range of the signal that is desired, i.e., channel 3 and 24. These spurious signals, or IDPs, then interfere with the signal that is desired. Accordingly, a figure of merit for the spurious signals is called IIP3, which stands for input third order intercept point.

IIP3, as is well known, describes how strong the IDPs are. The system IIP3 is degraded by the added gain stage that is meant to improve the system noise figure. For example, if an LNA whose gain is 15 dB is added in, the the IIP3 of the system will be degraded by no less than 15 dB. Accordingly, equation (2) describes the strength of the IDPs of the system.

$$1/IIP3_{Total}=1/IIP3_{1st}+G_{1st}/IIP3_{2nd} \quad (2)$$

Accordingly, while added gain will improve system noise figure for better receiver sensitivity, the added gain could degrade the total IIP3 and therefore adversely affect the performance of the system.

In order to solve the dilemma, the traditional approach is to add the LNA 12 (gain stage 1), and improve the IIP3 of the mixer 16 (gain stage 2). In so doing, in an ideal environment an increase on the $G_{1st}$ (numerator) should be matched by an increase on the $IIP3_{2nd}$ (denominator) to maintain good $IIP3_{Total}$, as suggested by the second term in Eq.2. However, improving the IIP3 means either higher power consumption or more feedback (gain reduction) for the mixer. Since higher power consumption is not a preferred solution in general, the designer would end up with a situation that extra gain is added in the front but some gain has to be thrown out in the following stage, thus requires even more stages to be inserted in the system thereby adding to the inefficiency of the system.

Accordingly, what is needed is a system and method for overcoming the above-identified problem. The present invention addresses such a need.

SUMMARY OF THE INVENTION

A mixer is disclosed. The mixer comprises a high isolation gain stage and an impedance transformation network coupled to the gain stage. The mixer includes a plurality of switching devices coupled to the network and a phase shifter coupled to the plurality of switching devices. The mixer is utilized as a receiver and a low noise amplifier is not needed.

A receiver in accordance with the present invention achieves high gain and low noise in the mixer and therefore eliminates the need for a separate LNA. In so doing, an isolation gain stage achieves high gain, and image noise is rejected before entering the mixer stage.

DETAILED DESCRIPTION

The present invention relates generally to a superheterodyne receiver and more particularly to utilizing a mixer as such a receiver. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A receiver in accordance with the present invention achieves high gain and low noise the mixer and therefore eliminates the need for a separate LNA. In so doing, an isolation gain stage achieves high gain, and image noise is rejected before entering the mixer stage.

Figure 1:
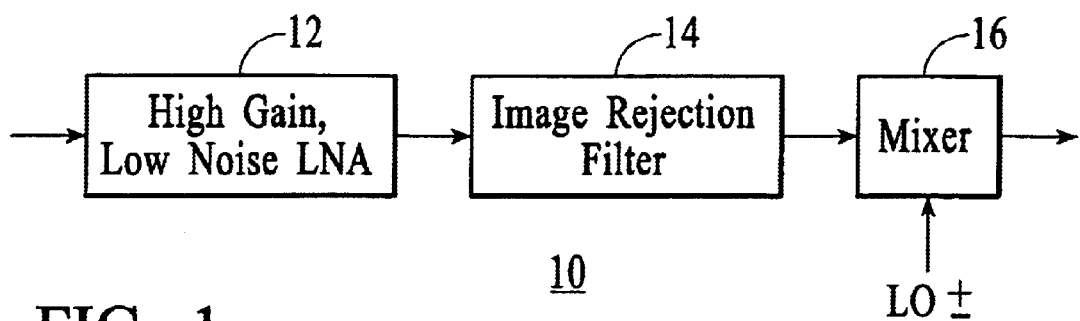
FIG. 1 illustrates a conventional superheterodyne receiver.
Figure 2:
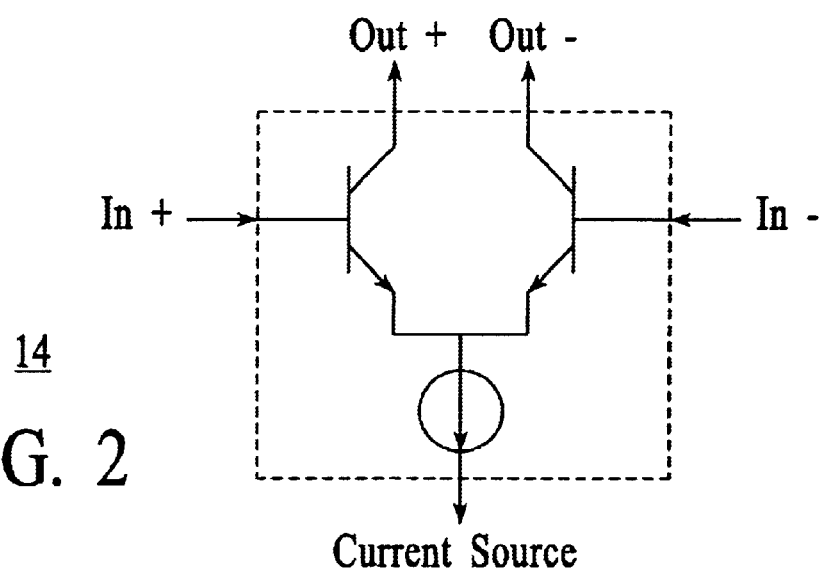
FIG. 2 illustrates a conventional LNA.
Figure 3:
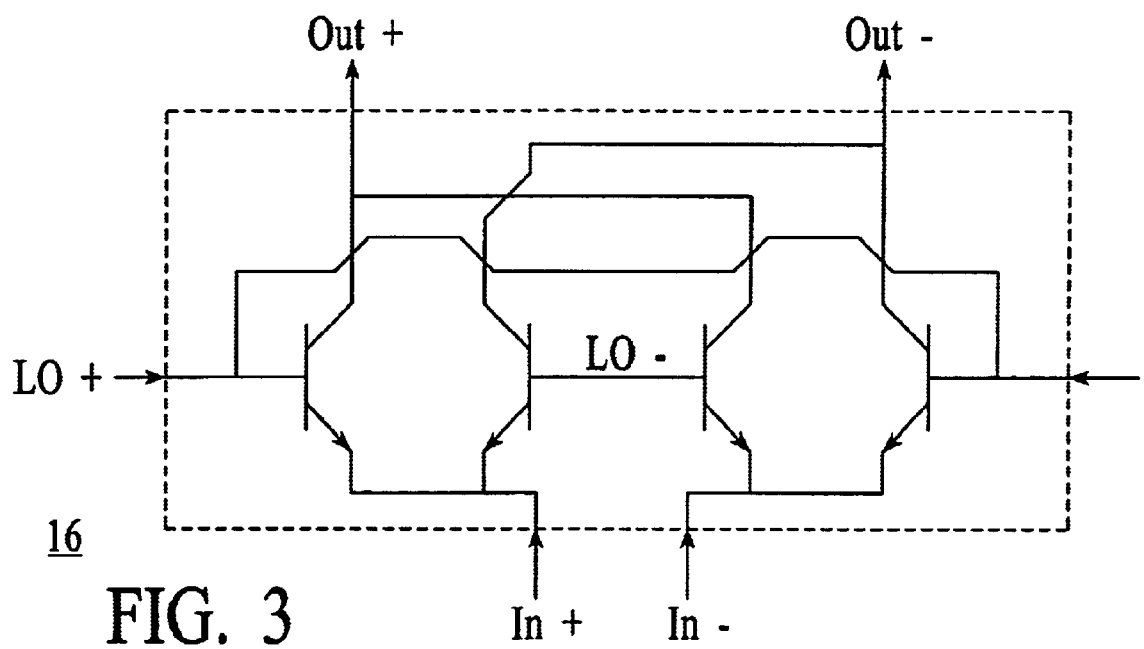
FIG. 3 illustrates a conventional active mixer, also known as Gilbert Cell Mixer.
Figure 4:
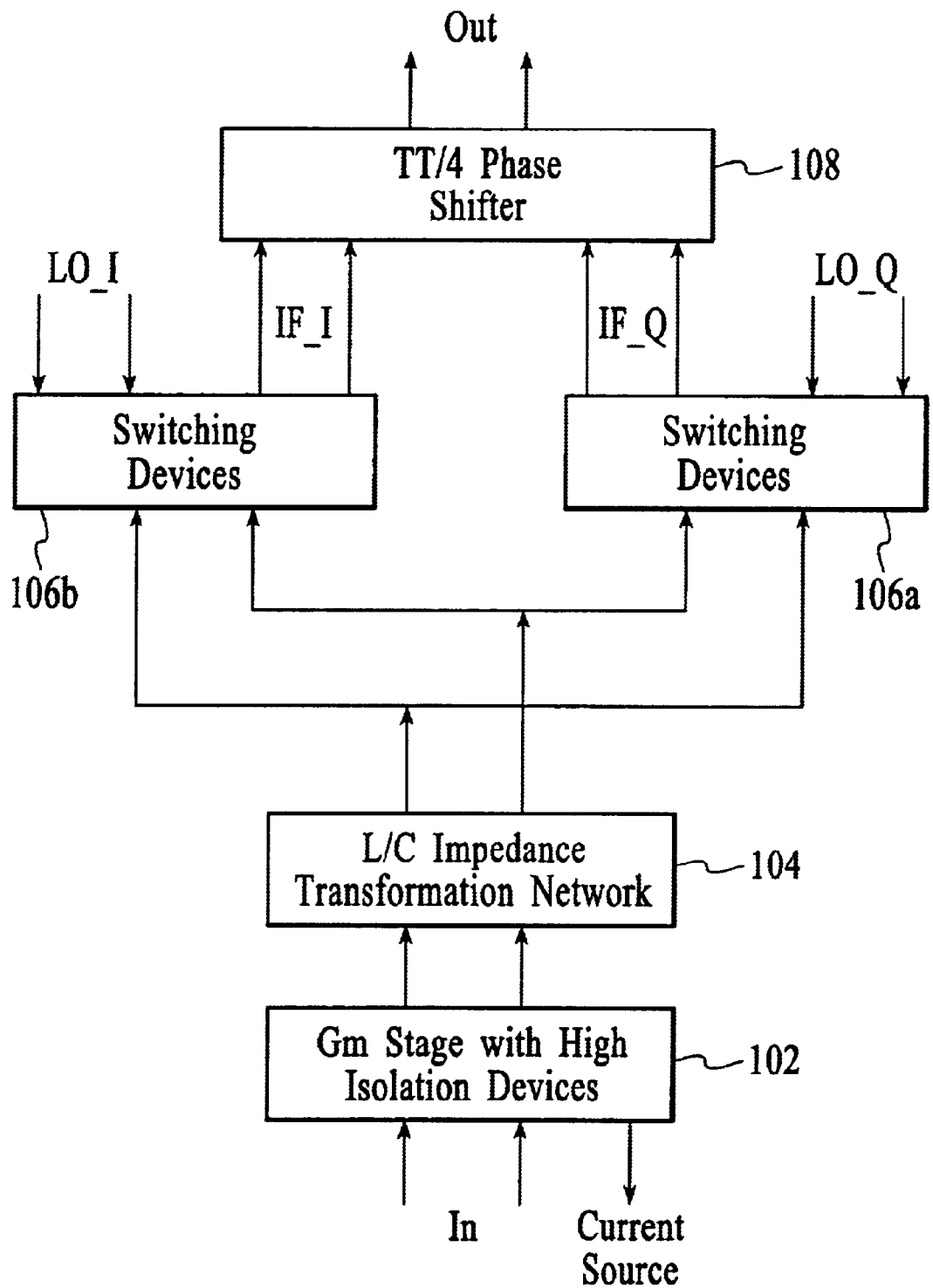
FIG. 4 illustrates a high gain, low noise mixer in accordance with the present invention.

To describe the present invention in more detail, refer now to the following discussion. FIG. 4 illustrates a high gain, low noise mixer 100 in accordance with the present invention. The high gain low noise mixer 100 includes a high isolation gain stage 102 which receives the input signals, an L/C impedance transformation network 104 coupled to the gain stage 102. The mixer 100 includes a plurality of switching devices 106a and 106b, which are driven by quadrature LO signals I and Q, coupled to the network 104. The mixer 100 finally includes a phase shifter 108 coupled to the switching devices 106a and 106b. Since a typical mixer can capture image noise, and thus doubles the noise power at the output, an image rejection scheme is implemented to prevent image noise from being received. The image rejection scheme comprises the switching devices 106a and 106b driven by quadrature I/O signals I and Q, and post-mixer phase shifter 108.

Figure 5:
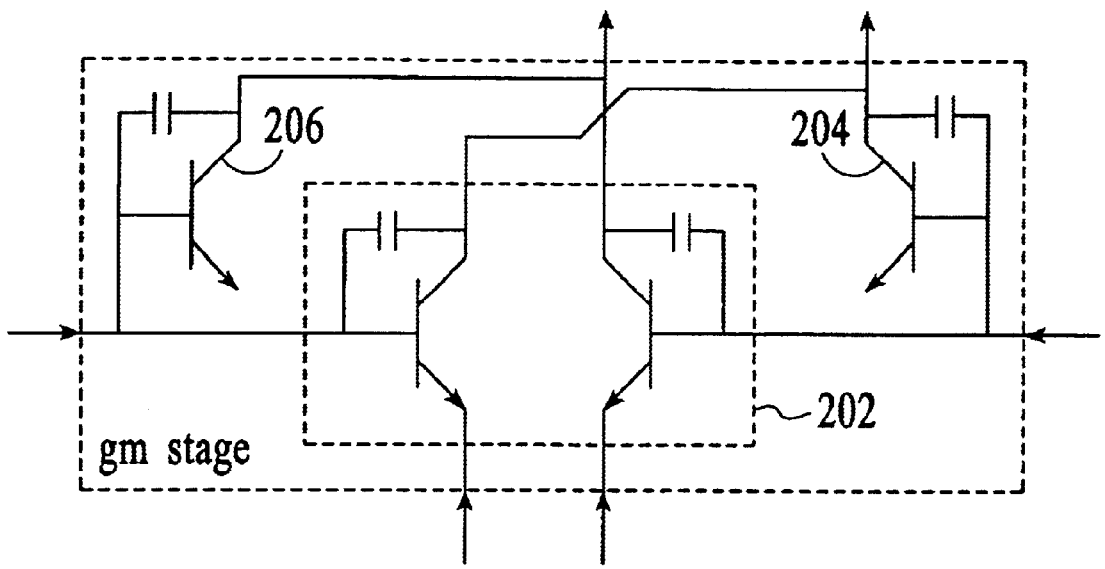
FIG. 5 illustrates a high isolation gain stage in accordance with the present invention.

FIG. 5 illustrates a high isolation gain stage 102 in accordance with the present invention. The high isolation gain stage 102 is disclosed in co-pending U.S. patent application Ser. No. 10/127,909, entitled "Gain Stage That Minimizes the Miller Effect," and filed on Apr. 22, 2002, which is incorporated in its entirety herein.

The gain stage 102 comprises a differential stage 202 that provides two voltages of equal and opposites polarities and a plurality of devices 204 and 206 that are cross coupled to the first stage. The plurality of devices 204 and 206 minimize the Miller Effect capacitance in the differential stage. Accordingly, a system and method in accordance with the present invention utilizes an at least one extra device on the same die as the first stage to provide an impedance match. In so doing, a broadband cancellation of the Miller Effect is achieved. Moreover, the matching is valid over an extended temperature range. Therefore, the gain provided by the gain stage 102 can be very high.

Figure 6:
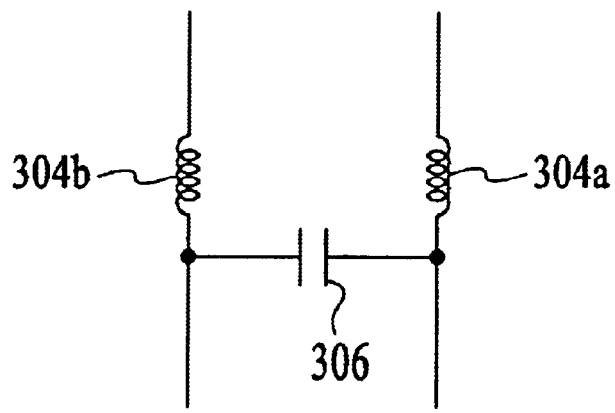
FIG. 6 illustrates an embodiment of an impedance transformation network in accordance with the present invention.

To improve the gain of the switching devices 106a and 106b without affecting DC continuity, an L/C impedance transformation network 104 raises the impedance of the switching devices 106a and 106b for additional gain. FIG. 6 illustrates an embodiment of an impedance transformation network 104 in accordance with the present invention. Since the switching devices exhibit low impedance, the impedance transformation network 104 requires small L values 304a and 304b and a large C value 306, and is ideally suitable for IC implementation.

A receiver in accordance with the present invention achieves high gain and low noise in the mixer and therefore eliminates the need for a separate LNA. In so doing, an isolation gain stage achieves high gain, and image noise is rejected before entering the mixer stage. As a result, this high-gain, low-noise mixer can match the system gain, noise figure and linearity of traditional superheterodyne receiver.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A mixer comprising;

a high isolation gain stage wherein the high isolation gain stage further comprises a differential stage, the differential stage further comprising first and second active devices; and a plurality of devices cross coupled to the differential stage, the plurality of devices further comprising first and second extra active devices and the first and second extra active devices are identical to the first and second active devices; wherein the plurality of devices minimize the Miller Effect capacitance in the differential stage;

an impedance transformation network coupled to the gain stage;

a plurality of switching devices coupled to the network; and a phase shifter coupled to the plurality of switching devices wherein the mixer is utilized as a receiver and a low noise amplifier is not needed.

2. The mixer of claim 1 wherein the impedance transformation network increases the impedance of the plurality of switching device.

3. The mixer of claim 1 wherein the plurality of switching devices exhibits low impedance.

4. The mixer of claim 3 wherein the impedance transformation network includes small L values and a large C value.

5. The mixer of claim 1 wherein the first and second extra devices are impedance matched to the first and second active devices.

6. The mixer of claim 1 wherein the first and second active devices comprise any of a CMOS device, FET device, HBT device and bipolar device.

7. The mixer of claim 1 wherein the first and second active devices receive signals of opposite polarities.

8. The mixer of claim 1 wherein the differential stage and the plurality of devices are on a same die of a semiconductor substrate.

9. The mixer of claim 1 wherein a collector of the first active device is coupled to the collector of the second extra active device and a collector of the second active device is coupled to the collector of the first extra active device, and wherein the base of the first active device is coupled to the base of the first extra active device and the base of the second active device is coupled to the base of the second extra active device.

10. A mixer comprising:

a high isolation gain stage wherein the high isolation gain stage further comprises a first stage that provides two equal voltages of opposite polarities; and at least one device cross coupled to the first stage, wherein the at least one devices minimizes the Miller Effect capacitance in the first stage;

an impedance transformation network coupled to the gain stage;

a plurality of switching devices coupled to the network; and a phase shifter coupled to the plurality of switching devices wherein the mixer is utilized as a receiver and a low noise amplifier is not needed.

11. The mixer of claim 10 wherein the first stage comprises a transformer and an active device coupled to the transformer.

12. A mixer comprising;

a high isolation gain stage;

an impedance transformation network coupled to the gain stage;

a plurality of switching devices coupled to the network; and a phase shifter coupled to the plurality of switching devices wherein the mixer is utilized as a receiver and a low noise amplifier is not needed, wherein the plurality of switching devices are driven by quadrature I/O signals which, in cooperation with the phase shifter, comprises an image rejection scheme.

* * * * *